(12) United States Patent
Han et al.

(10) Patent No.: US 11,870,419 B2
(45) Date of Patent: Jan. 9, 2024

(54) BULK ACOUSTIC WAVE RESONATOR

(71) Applicant: Samsung Electro-Mechanics Co., Ltd., Suwon-si (KR)

(72) Inventors: Won Han, Suwon-si (KR); Sang Uk Son, Suwon-si (KR); Tae Yoon Kim, Suwon-si (KR); Chang Hyun Lim, Suwon-si (KR); Sang Heon Han, Suwon-si (KR); Jong Beom Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 367 days.

(21) Appl. No.: 17/222,018

(22) Filed: Apr. 5, 2021

(65) Prior Publication Data
US 2022/0116016 A1 Apr. 14, 2022

(30) Foreign Application Priority Data
Oct. 13, 2020 (KR) .................. 10-2020-0131876

(51) Int. Cl.
*H03H 9/17* (2006.01)
(52) U.S. Cl.
CPC .................... *H03H 9/173* (2013.01)
(58) Field of Classification Search
CPC .................................................... H03H 9/173
See application file for complete search history.

(56) References Cited

U.S. PATENT DOCUMENTS

| 6,812,619 | B1 | 11/2004 | Kaitila et al. |
| 7,280,007 | B2 | 10/2007 | Feng et al. |
| 9,571,064 | B2 | 2/2017 | Burak et al. |

(Continued)

FOREIGN PATENT DOCUMENTS

| CN | 110868184 A | 3/2020 |
| CN | 111010130 A | 4/2020 |

(Continued)

OTHER PUBLICATIONS

Taiwanese Office Action dated Aug. 31, 2021, in counterpart Taiwanese Patent Application No. 110113148 (8 pages in English and 10 pages in Mandarin).

(Continued)

*Primary Examiner* — Bryan P Gordon
(74) *Attorney, Agent, or Firm* — NSIP Law

(57) ABSTRACT

A bulk acoustic wave resonator includes a substrate, a first electrode, wherein a cavity is formed between the substrate and the first electrode, a piezoelectric layer disposed on the first electrode and overlapping at least a portion of the first electrode, a second electrode disposed on the piezoelectric layer and overlapping at least a portion of the piezoelectric layer, a passivation layer having at least a portion disposed on the second electrode and overlapping at least a portion of the second electrode, and a lower frame spaced apart from the substrate and having a portion of the cavity disposed therebetween. Any one of the second electrode and the passivation layer includes a protruding portion having a first thickness and an extended portion having a second thickness less than the first thickness, and an inner end of the lower frame and an end of the protruding portion are spaced apart horizontally.

22 Claims, 19 Drawing Sheets

(56) References Cited

U.S. PATENT DOCUMENTS

| | | |
|---|---|---|
| 10,250,228 B2 | 4/2019 | Chang et al. |
| 2007/0069606 A1 | 3/2007 | Matsumoto et al. |
| 2011/0298564 A1* | 12/2011 | Iwashita ............... H03H 9/173 333/187 |
| 2014/0203686 A1* | 7/2014 | Song ................... H10N 30/074 310/326 |
| 2015/0318837 A1* | 11/2015 | Zou ................... H03H 9/02086 333/187 |
| 2017/0310303 A1* | 10/2017 | Thalhammer ........... H03H 9/58 |
| 2017/0338399 A1 | 11/2017 | Kim et al. |
| 2018/0123554 A1* | 5/2018 | Kyoung ............. H03H 9/02086 |
| 2018/0254764 A1 | 9/2018 | Lee et al. |
| 2019/0356293 A1* | 11/2019 | Kim ...................... H03H 9/132 |
| 2020/0083861 A1* | 3/2020 | Matsuo ................. H03H 9/564 |
| 2020/0112296 A1 | 4/2020 | Lee et al. |
| 2020/0195223 A1 | 6/2020 | Kim et al. |
| 2020/0204154 A1 | 6/2020 | Daimon |
| 2020/0228089 A1 | 7/2020 | Tajic et al. |

FOREIGN PATENT DOCUMENTS

| | | |
|---|---|---|
| JP | 2018-110379 A | 7/2018 |
| KR | 10-2014-0094283 A | 7/2014 |
| KR | 10-2017-0130228 A | 11/2017 |
| KR | 10-2018-0101129 A | 9/2018 |
| KR | 10-2020-0039521 A | 4/2020 |
| TW | 202029644 A | 8/2020 |
| WO | WO 2010/095640 A1 | 8/2010 |

OTHER PUBLICATIONS

Korean Office Action dated Oct. 21, 2022, in counterpart Korean Patent Application No. 10-2020-0131876 (7 pages in English, 6 pages in Korean).

* cited by examiner

BULK ACOUSTIC WAVE RESONATOR

CROSS-REFERENCE TO RELATED APPLICATIONS

This application claims the benefit under 35 USC 119(a) of Korean Patent Application No. 10-2020-0131876 filed on Oct. 13, 2020, in the Korean Intellectual Property Office, the entire disclosure of which is incorporated herein by reference for all purposes.

BACKGROUND

1. Field

The present disclosure relates to a bulk acoustic wave resonator.

2. Description of the Background

A bulk acoustic wave (BAW) filter is a core element passing signals having a desired frequency band among radio frequency (RF) signals therethrough and blocking signals having an undesired frequency band among the RF signals in a front-end module of a smartphone, a tablet personal computer (PC), or the like, and in accordance with the growth of the mobile and base state communication market, a demand for the bulk acoustic wave (BAW) filter has increased.

Meanwhile, the BAW filter may include a plurality of BAW resonators, and if the Q performance of the BAW resonators are good, the characteristic (Skirt characteristic) of being able to select only the desired band in the BAW filter is improved. In addition, insertion loss and attenuation performance in the BAW filter are improved.

To this end, it is necessary to form a frame around the resonator and to control the width and thickness of the frame to drive a resonance waveform generated in the resonator in a piston mode.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes a substrate, a first electrode, wherein a cavity is formed between the substrate and the first electrode, a piezoelectric layer disposed on the first electrode and overlapping at least a portion of the first electrode, a second electrode disposed on the piezoelectric layer and overlapping at least a portion of the piezoelectric layer, a passivation layer having at least a portion disposed on the second electrode and overlapping at least a portion of the second electrode, and a lower frame spaced apart from the substrate and having a portion of the cavity disposed therebetween, wherein any one of the second electrode and the passivation layer includes a protruding portion having a first thickness and an extended portion having a second thickness less than the first thickness, and wherein an inner end of the lower frame and an end of the protruding portion are spaced apart in a horizontal direction.

At least a portion of the extended portion may overlap the lower frame.

The lower frame may be formed of the same material as the first electrode.

The lower frame may be disposed under the first electrode and formed of a different material from the first electrode.

The lower frame may be formed of an insulating material having a density lower than that of the first electrode.

The passivation layer may include the protruding portion and the extended portion, and the passivation layer may be formed of an insulating material having a density lower than that of the first electrode.

The bulk acoustic wave resonator may further include an additional layer disposed between the lower frame and the first electrode.

The second electrode may include a frame portion having at least a portion overlapping the lower frame and having a thickness greater than the first thickness.

An inner end of the frame portion and the inner end of the lower frame may be spaced apart in the horizontal direction.

The bulk acoustic wave resonator may further include an etching preventing layer disposed to surround the cavity.

The bulk acoustic wave resonator may further include a sacrificial layer disposed outside of the etching preventing layer.

The bulk acoustic wave resonator may further include an insertion layer disposed between the first electrode and the piezoelectric layer.

In another general aspect, a bulk acoustic wave resonator includes a substrate, a first electrode, wherein a cavity is disposed between the substrate and the first electrode, a piezoelectric layer disposed on the first electrode and overlapping at least a portion of the first electrode, a second electrode disposed on the piezoelectric layer and overlapping at least a portion of the piezoelectric layer, a passivation layer having at least a portion disposed on the second electrode and overlapping at least a portion of the second electrode, and a lower frame spaced apart from the substrate and having a portion of the cavity disposed therebetween, wherein any one of the second electrode and the passivation layer includes a protruding portion having a first thickness and an extended portion having a second thickness less than the first thickness, and wherein an active region in which the protruding portion, the piezoelectric layer, and the first electrode all overlap, a first region disposed between an end of the active region and an inner end of the lower frame, and a second region disposed outside of the first region and in which the extended portion and the lower frame overlap, are continuously disposed.

Frequencies $f_0$, $f_1$, and $f_2$ in the active region, the first region, and the second region may have a relationship of $f_2 < f_0 < f_1$.

When lateral wave numbers in the active region, the first region, and the second region are $\beta_0$, $\beta_1$, and $\beta_2$, $\beta_0$ may have 0, $\beta_1$ may have a real number value, and $\beta_2$ may have an imaginary number value in a resonance frequency.

When acoustic impedances in the active region, the first region, and the second region are $z_0$, $z_1$, and $z_2$, a value of $z_2$ may be greater than a value of $z_0$.

In another general aspect, a bulk acoustic wave resonator includes a substrate, a first electrode disposed on and spaced apart from the substrate by a cavity, a piezoelectric layer disposed on the first electrode, a second electrode disposed on the piezoelectric layer, an upper layer of the bulk acoustic wave resonator disposed on the second electrode, and a lower frame spaced apart from the substrate and having a portion of the cavity disposed therebetween, wherein the upper layer includes a protruding portion having a first thickness and an extended portion having a second thickness less than the first thickness, and wherein an inner end of the lower frame and an end of the protruding portion are spaced apart in a horizontal direction.

The upper layer may include an upper portion of the second electrode or a passivation layer disposed on the second electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
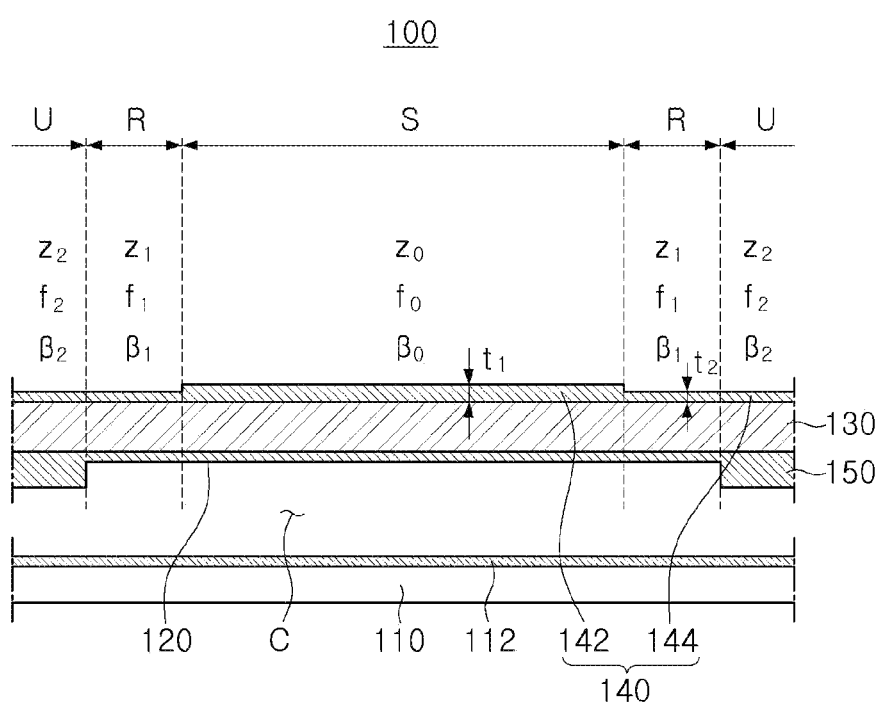
FIG. 1 is a schematic configuration view illustrating a main configuration of a bulk acoustic wave resonator according to an example embodiment in the present disclosure.

Hereinafter, while example embodiments of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of functions and constructions that would be well known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Herein, it is noted that use of the term "may" with respect to an example or embodiment, for example, as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or a part of the whole element less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," and the like may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

An aspect of the present disclosure may provide a bulk acoustic wave resonator that may reduce an occurrence of spurious noise and notching.

FIG. 1 is a schematic configuration view illustrating a partial configuration of a bulk acoustic wave resonator according to an example embodiment in the present disclosure.

Referring to FIG. 1, a bulk acoustic wave resonator 100 may include, for example, a substrate 110, a first electrode 120, a piezoelectric layer 130, and a second electrode 140.

The substrate 110 may be a silicon substrate. For example, a silicon wafer or a silicon on insulator (SOI) type substrate may be used as the substrate 110.

An insulating layer 112 may be formed on an upper surface of the substrate 110 and may electrically isolate components disposed on the substrate 110 from the substrate 110. In addition, the insulating layer 112 may prevent the substrate 110 from being etched by an etching gas at the time of forming a cavity C in a process of manufacturing the bulk acoustic wave resonator.

In this case, the insulating layer 112 may be formed of at least one of silicon dioxide ($SiO_2$), silicon nitride ($Si_3N_4$), aluminum oxide ($Al_2O_3$), and aluminum nitride (AlN), and may be formed by any one of a chemical vapor deposition process, a radio frequency (RF) magnetron sputtering process, and an evaporation process.

The cavity C may be disposed between the first electrode 120 and the substrate 110. As an example, the first electrode 120 may be used as any one of an input electrode and an output electrode that inputs and outputs an electrical signal such as a radio frequency (RF) signal.

Meanwhile, the first electrode 120 may be formed of, for example, a conductive material such as molybdenum (Mo) or an alloy thereof. However, the first electrode 120 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

In addition, a lower frame 150 may be provided at an edge of the first electrode 120. The lower frame 150 may be disposed in the cavity C and may be formed integrally with the first electrode 120 or may be formed of the same material as the first electrode 120.

The piezoelectric layer 130 may overlap at least a portion of the first electrode 120. Meanwhile, the piezoelectric layer 130 may be a portion that causes a piezoelectric effect converting electrical energy into mechanical energy in the form of an elastic wave, and may be formed of one of an aluminum nitride (AlN), a zinc oxide (ZnO), and a lead zirconium titanium oxide (PZT; PbZrTiO). In particular, in the case in which the piezoelectric layer 130 is formed of the aluminum nitride (AlN), the piezoelectric layer 130 may further include a rare earth metal. As an example, the rare earth metal may include at least one of scandium (Sc), erbium (Er), yttrium (Y), and lanthanum (La). In addition, as an example, a transition metal may include at least one of titanium (Ti), zirconium (Zr), hafnium (Hf), tantalum (Ta), and niobium (Nb). In addition, the piezoelectric layer 130 may also include magnesium (Mg), a divalent metal.

The second electrode 140 may overlap at least a portion of the piezoelectric layer 130. Meanwhile, the second electrode 140 may be used as any one of an input electrode and an output electrode that inputs and outputs an electrical signal such as a radio frequency (RF) signal. That is, in a case in which the first electrode 120 is used as the input electrode, the second electrode 140 may be used as the output electrode, and in a case in which the first electrode 120 is used as the output electrode, the second electrode 140 may be used as the input electrode.

The second electrode 140 may be formed of, for example, a conductive material such as molybdenum (Mo) or an alloy thereof. However, the second electrode 140 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

Meanwhile, the second electrode 140 may include a protruding portion 142 having a first thickness t1 and an extended portion 144 having a thickness less than that of the protruding portion 142. The thickness of the extended portion 144 is defined as a second thickness t2.

In addition, a region in which the protruding portion 142, the piezoelectric layer 130, and the first electrode 120 are all disposed to overlap is defined as an active region S, a region disposed between an end of the protruding portion 142 and an inner end of the lower frame 150 is defined as a first region R, and a region in which the extended portion 144 and the lower frame 150 are disposed to overlap is defined as a second region U.

Meanwhile, the first region R may be disposed outside of the active region S, and the second region U may be disposed outside of the first region R. In addition, the active region S, the first region R, and the second region U may be continuously disposed.

In addition, frequencies in the active region S, the first region R, and the second region U are referred to as $f_0$, $f_1$, and $f_2$, lateral wave numbers in the active region S, the first region R, and the second region U are referred to as $\beta_0$, $\beta_1$, and $\beta_2$, and acoustic impedances in the active region S, the first region R, and the second region U are referred to as $z_0$, $z_1$, and $z_2$, respectively.

In addition, the frequencies $f_0$, $f_1$, and $f_2$ in the active region S, the first region R, and the second region U may have a relationship of $f_2 < f_0 < f_1$.

In addition, in a resonance frequency, $\beta_0$ may be 0, $\beta_1$ may be a real number value, and $\beta_2$ may be an imaginary number value.

A passivation layer may be disposed on the second electrode 140. Although the passivation layer is not illustrated in the drawing, the passivation layer may overlap at least a portion of the second electrode 140.

As described above, since the second electrode 140 includes the protruding portion 142 and the extended portion 144 and the lower frame 150 disposed in the cavity C is provided, an occurrence of spurious noise and notch may be reduced.

Accordingly, the performance of the bulk acoustic wave resonator 100 may be improved.

Figure 2:
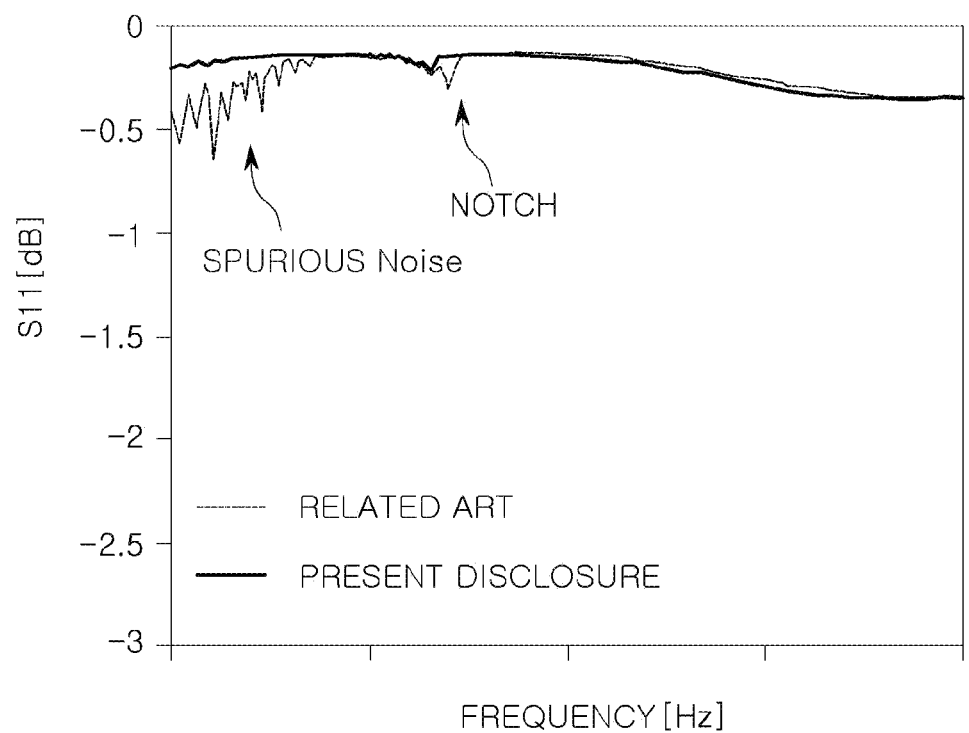
FIG. 2 is a graph illustrating values of S11 of the bulk acoustic wave resonator according to an example embodiment in the present disclosure and a resonator according to the related art.

This will be described in more detail hereinafter. As illustrated in FIG. 2, it may be seen that the bulk acoustic wave resonator 100 according to the above embodiment may reduce the occurrence of spurious noise and notch compared to the related art in which a frame and a trench are provided in the second electrode.

A resonator according to the related art, in which the frame and the trench are provided in the second electrode, forms the frame and the trench in the second electrode through a fine etching and deposition process on the second electrode during manufacturing. However, an influence of a chemical process of removing a masking layer after forming the masking layer during the etching and deposition process and a non-uniform effect of etching due to shadowing during a plasma etching process occur. Accordingly, due to an addition of process errors between processes, an ideal structure shape may not be realized, and fine steps and/or gradients may be added around the trench, which in turn causes spurious noise and/or notch.

However, in the bulk acoustic wave resonator 100 according to the present disclosure, since the second electrode 140 includes the protruding portion 142 and the extended portion 144 and the lower frame 150 disposed in the cavity C is provided, the process as in the related art is not performed, and thus the occurrence of spurious noise and notch may be prevented.

Hereinafter, a change in performance according to a difference in thickness of the protruding portion and the extended portion of the second electrode and a width of the first region R will be described.

Figure 3:
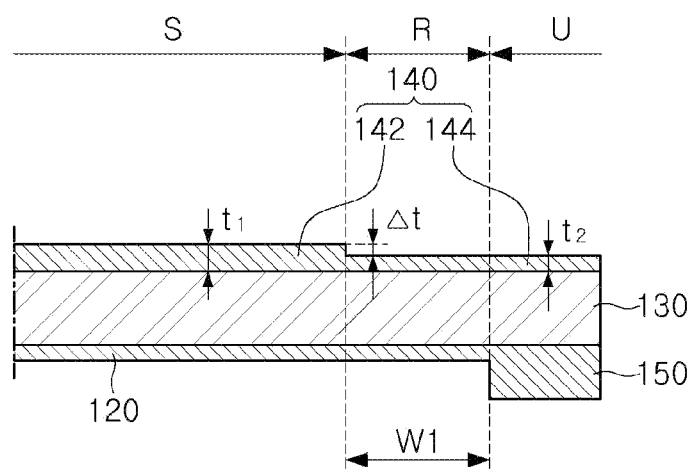
FIG. 3 is a view illustrating a difference in thickness of a protruding portion and an extended portion of a second electrode and a width of a first region.
Figure 4:
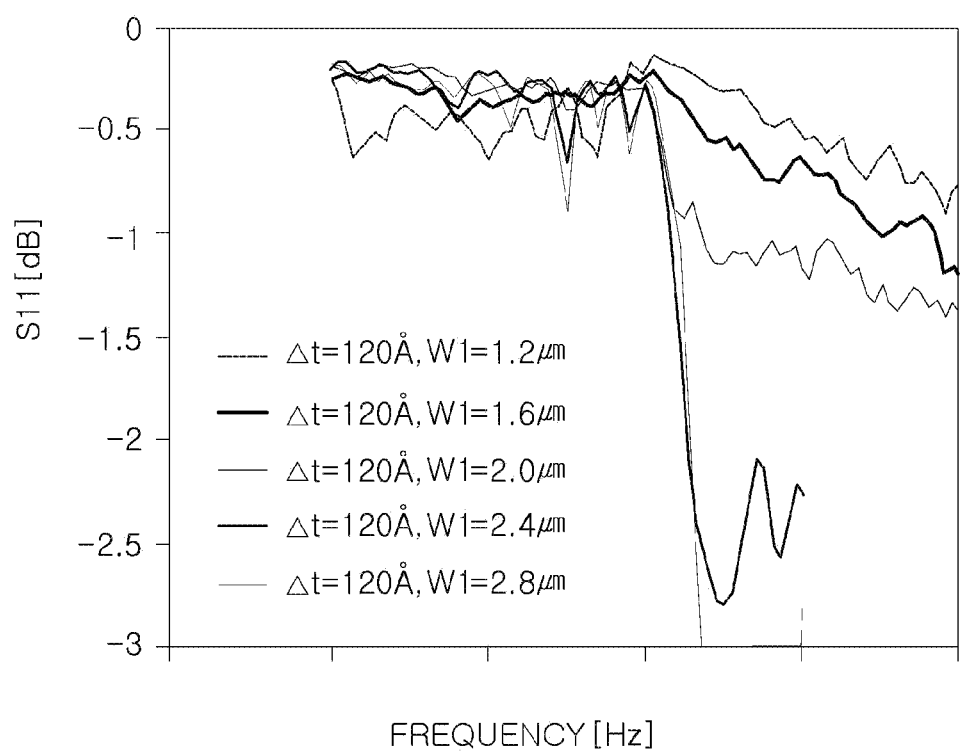
FIG. 4 is a graph illustrating a value of S11 according to the width of the first region R when the difference in thickness of the protruding portion and the extended portion of the second electrode is 120 Å (Angstroms).
Figure 5:
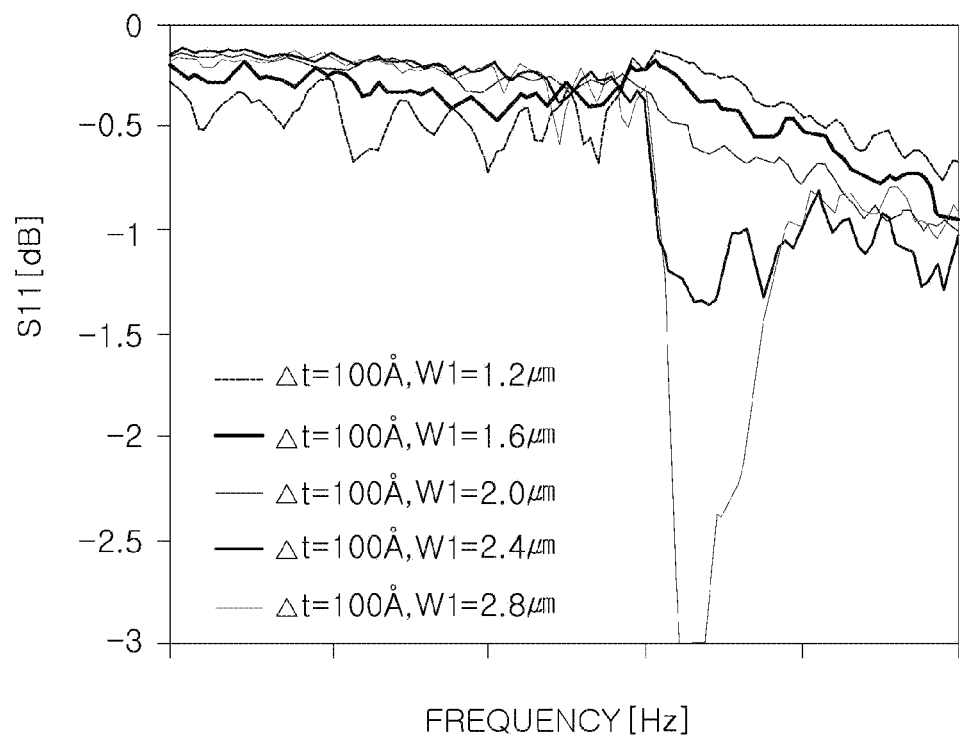
FIG. 5 is a graph illustrating a value of S11 according to the width of the first region R when the difference in thickness of the protruding portion and the extended portion of the second electrode is 100 Å.
Figure 6:
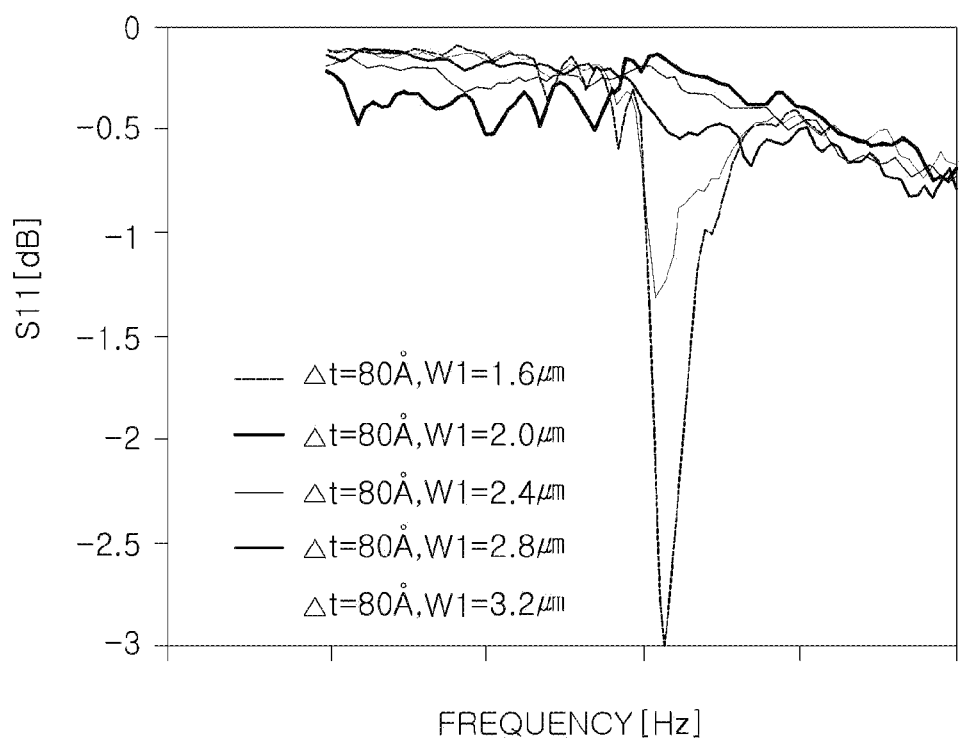
FIG. 6 is a graph illustrating a value of S11 according to the width of the first region when the difference in thickness of the protruding portion and the extended portion of the second electrode is 80 Å.

FIG. 3 is a view illustrating a difference in thickness of a protruding portion and an extended portion of a second electrode and a width of a first region, FIG. 4 is a graph illustrating a value of S11 according to the width of the first region R when the difference in thickness of the protruding portion and the extended portion of the second electrode is 120 Å (Angstroms), FIG. 5 is a graph illustrating a value of S11 according to the width of the first region R when the difference in thickness of the protruding portion and the extended portion of the second electrode is 100 Å; and FIG. 6 is a graph illustrating a value of S11 according to the width of the first region when the difference in thickness of the protruding portion and the extended portion of the second electrode is 80 Å.

Meanwhile, FIG. 4 is a graph illustrating a value of S11 when the width W1 of the first region R is 1.2 μm (microns), 1.6 μm, 2.0 μm, 2.4 μm, and 2.8 μm in a state in which the difference in thickness (Δt) of the protruding portion 142 and the extended portion 144 of the second electrode 140 is fixed to 120 Å. As illustrated in FIG. 4, it may be seen that a notch occurs when the width W1 of the first region R is 2.0 μm or more. Here, the difference in thickness (Δt) of the protruding portion 142 and the extended portion 144 of the second electrode 140 refers to a value obtained by subtracting a second thickness t2, the thickness of the extended portion 144, from a first thickness t1, the thickness of the protruding portion 142. Further, the width W1 of the first region R refers to a distance in a horizontal direction between the end of the protruding portion 142 and the inner end of the lower frame 150.

In addition, as illustrated in FIG. 5, it may be seen that a notch occurs when the difference in thickness (Δt) of the protruding portion 142 and the extended portion 144 of the second electrode 140 is 100 Å and the width W1 of the first region R is 2.4 μm or more. In addition, as illustrated in FIG. 6, it may be seen that the notch occurs when the difference in thickness (Δt) of the protruding portion 142 and the extended portion 144 of the second electrode 140 is 80 Å and the width W1 of the first region R is 2.8 μm or more.

Meanwhile, for the occurrence of minimum spurious noise when the difference in thickness (Δt) of the protruding portion 142 and the extended portion 144 of the second electrode 140 is 120 Å, the width W1 of the first region R needs to be 1.6 μm or more. In addition, for the occurrence of minimum spurious noise when the difference in thickness (Δt) of the protruding portion 142 and the extended portion 144 of the second electrode 140 is 100 Å, the width W1 of the first region R needs to be 1.6 μm or more. In addition, for the occurrence of minimum spurious noise when the difference in thickness (Δt) of the protruding portion 142 and the extended portion 144 of the second electrode 140 is 80 Å, the width W1 of the first region R needs to be 2.0 μm or more.

Meanwhile, as a difference value between the width W1 of the first region R for occurrence of the minimum spurious noise and the width W1 of the first region R in which the notch occurs is larger, the change in performance due to process error may be reduced. For example, when the difference in thickness (Δt) of the protruding portion 142 and the extended portion 144 of the second electrode 140 is 120 Å, the difference value between the width W1 of the first region R for occurrence of the minimum spurious noise and the width W1 of the first region R in which the notch occurs may be 0.4 μm, and when the difference in thickness (Δt) of the protruding portion 142 and the extended portion 144 of the second electrode 140 is 100 Å, the difference value between the width W1 of the first region R for occurrence of the minimum spurious noise and the width W1 of the first region R in which the notch occurs may be 0.8 μm. In addition, when the difference in thickness (Δt) of the protruding portion 142 and the extended portion 144 of the second electrode 140 is 80 Å, the difference value between the width W1 of the first region R for occurrence of the minimum spurious noise and the width W1 of the first region R in which the notch occurs may be 0.8 μm. Therefore, in the case in which the difference in thickness (Δt) of the protruding portion 142 and the extended portion 144 of the second electrode 140 is 100 Å and 80 Å, the change in performance due to the process error may be reduced as compared to the case in which the difference in thickness (Δt) of the protruding portion 142 and the extended portion 144 of the second electrode 140 is 120 Å.

Figure 7:
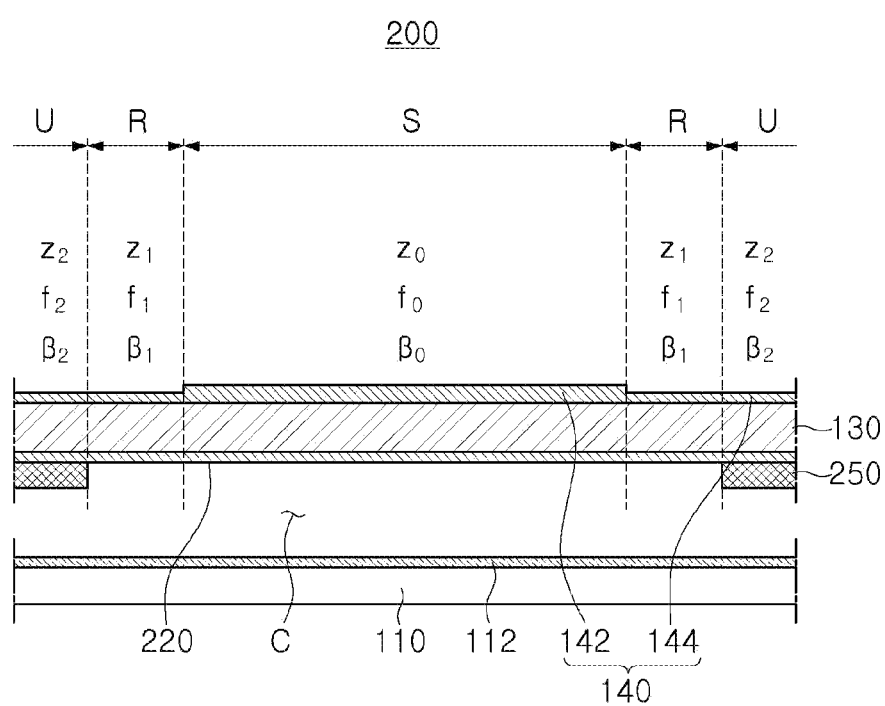
FIG. 7 is a schematic configuration view illustrating a main configuration of a bulk acoustic wave resonator according to an example embodiment in the present disclosure.

FIG. 7 is a schematic configuration view illustrating a partial configuration of a bulk acoustic wave resonator according to an example embodiment in the present disclosure.

Referring to FIG. 7, a bulk acoustic wave resonator 200 may include, for example, the substrate 110, a first electrode 220, the piezoelectric layer 130, the second electrode 140, and a lower frame 250.

Meanwhile, the substrate 110, the piezoelectric layer 130, and the second electrode 140 are the same components as those described above, and further detailed descriptions thereof will be omitted.

A cavity C may be disposed between the first electrode 220 and the substrate 110. As an example, the first electrode 220 may be used as any one of an input electrode and an output electrode that inputs and outputs an electrical signal such as a radio frequency (RF) signal.

Meanwhile, the first electrode 220 may be formed of, for example, a conductive material such as molybdenum (Mo) or an alloy thereof. However, the first electrode 220 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The lower frame 250 may be disposed to be spaced apart from the substrate 110 and a portion of the cavity C may be disposed under the lower frame 250. As an example, the lower frame 250 may be formed to have a ring shape on a bottom surface of the first electrode 220. In addition, the lower frame 250 may be formed of an insulating material having a density lower than that of the first electrode 220. For example, the lower frame 250 may be formed of an insulating material such as silicon oxide ($SiO_2$), silicon nitride (SiN), and aluminum oxide ($Al_2O_3$). Meanwhile, an inner end of the lower frame 250 and the end of the protruding portion 142 may be disposed to be spaced apart in the horizontal direction.

In addition, in the present example embodiment, the active region S, the first region R, and the second region U may also be continuously disposed.

As such, the lower frame 250 may be formed of the insulating material having the density lower than that of the first electrode 220. Accordingly, an acoustic impedance value for a lateral wave generated at an anti-resonant frequency becomes very large, and a difference between $z_2$ and $z_0$ may be increased. Therefore, the bulk acoustic wave resonator 200 may obtain higher Q performance. In addition, when a value of $z_2$ in the second region U is increased compared to $z_0$ in the active region S, a $kt^2$ performance corresponding to an electromechanical coupling coefficient may also be increased.

That is, as illustrated in Table 1 below, when the lower frame 250 is formed of molybdenum (Mo) and silicon oxide ($SiO_2$), it may be seen that the performance of the bulk acoustic wave resonator 200 is different. In more detail, it may be seen that $kt^2$ is larger by 0.1% and Q performance is larger by about 660 in the case of using silicon oxide ($SiO_2$), an insulator, as the material of the lower frame 250 as compared to the case in which the lower frame 250 is formed of molybdenum (Mo) the same as the material of the first electrode 220.

This is expressed because when silicon oxide ($SiO_2$), an insulator, is used as the material of the lower frame 250, an acoustic impedance value for a lateral wave generated at an anti-resonant frequency becomes larger.

TABLE 1

| Material of Lower Frame | $kt^2$[%] | Qs | Qp |
|---|---|---|---|
| Molybdenum (Mo) | 7.9 | 1190 | 2390 |
| Silicon Oxide ($SiO_2$) | 8.0 | 1280 | 3050 |

Figure 8:
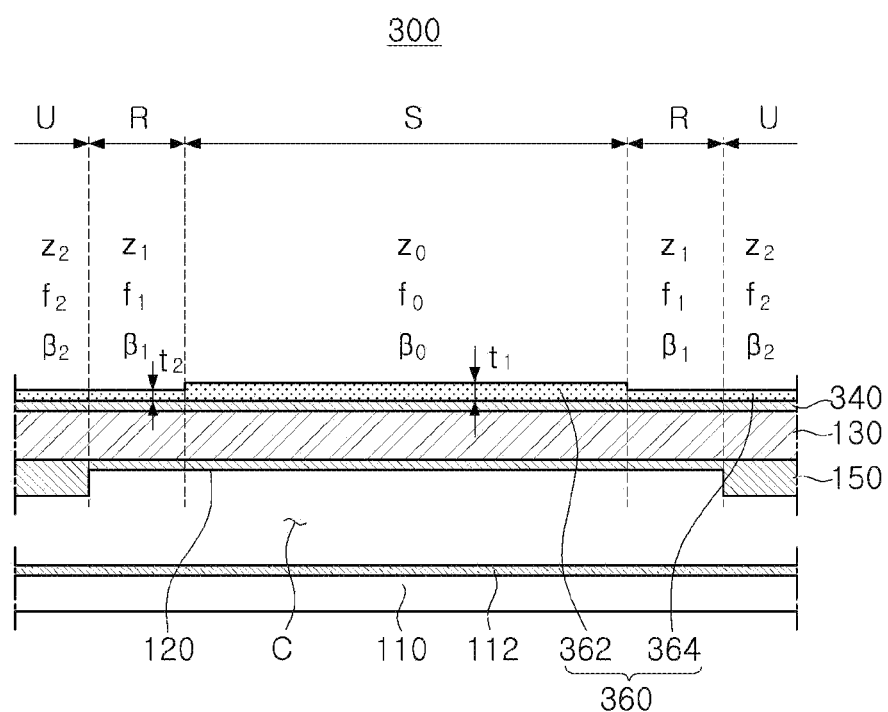
FIG. 8 is a schematic configuration view illustrating a main configuration of a bulk acoustic wave resonator according to an example embodiment in the present disclosure.

FIG. 8 is a schematic configuration view illustrating a partial configuration of a bulk acoustic wave resonator according to an example embodiment in the present disclosure.

Referring to FIG. 8, a bulk acoustic wave resonator 300 may include, for example, the substrate 110, the first electrode 120, the piezoelectric layer 130, a second electrode 340, and a passivation layer 360.

Meanwhile, since the first electrode 120, the piezoelectric layer 130, and the lower frame 150 are the same as the components described in the bulk acoustic wave resonator 100, further detailed descriptions thereof will be omitted herein.

The second electrode 340 may overlap at least a portion of the piezoelectric layer 130. Meanwhile, the second electrode 340 may be used as any one of an input electrode and an output electrode that inputs and outputs an electrical signal such as a radio frequency (RF) signal. That is, in a case in which the first electrode 120 is used as the input electrode, the second electrode 340 may be used as the output electrode, and in a case in which the first electrode 120 is used as the output electrode, the second electrode 340 may be used as the input electrode.

The second electrode 340 may be formed of, for example, a conductive material such as molybdenum (Mo) or an alloy thereof. However, the second electrode 340 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The passivation layer 360 may overlap at least a portion of the second electrode 340. Meanwhile, the passivation layer 360 may serve to prevent damage to the first electrode 120 and the second electrode 340 during the process. As an example, the passivation layer 360 may be formed of an insulating material. In other words, the passivation layer 360 may be formed of an insulating material such as silicon oxide ($SiO_2$), silicon nitride (SiN), and aluminum oxide ($Al_2O_3$) having a density lower than that of the first electrode 120. In addition, the passivation layer 360 may include a protruding portion 362 having a first thickness t1 and an extended portion 364 having a thickness less than that of the protruding portion 362. The thickness of the extended portion 364 is defined as a second thickness t2.

Meanwhile, in the present example embodiment, the active region S, the first region R, and the second region U may also be continuously disposed.

As described above, since the passivation layer 360 includes the protruding portion 362 and the extended portion 364, the value of the Lateral Wave Number $β_1$ in the first region R may be formed smaller as compared to the case in which the second electrode 140 of the bulk acoustic wave resonator 100 described above includes the protruding portion 142 and the extended portion 144. As a result, since the value of the width W1 of the first region R may be increased, the influence of the notch or the like that otherwise may occur due to the process error may be reduced.

Hereinafter, a change in performance according to a difference in thickness of the protruding portion and the extended portion of the passivation layer and a width of the first region R will be described.

Figure 9:
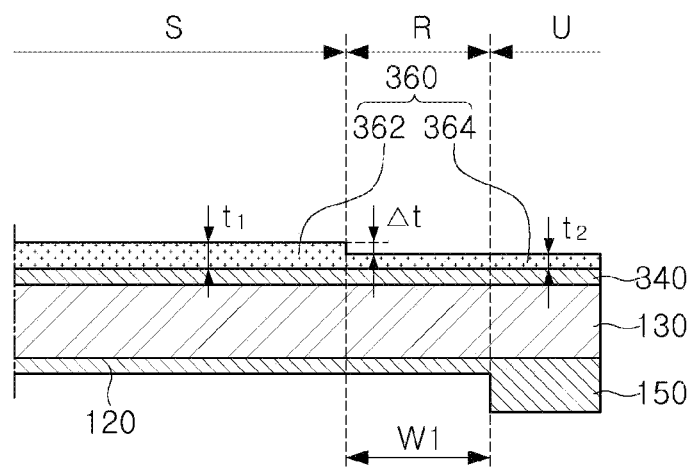
FIG. 9 is a view illustrating a difference in thickness of a protruding portion and an extended portion of a passivation layer and a width of a first region.
Figure 10:
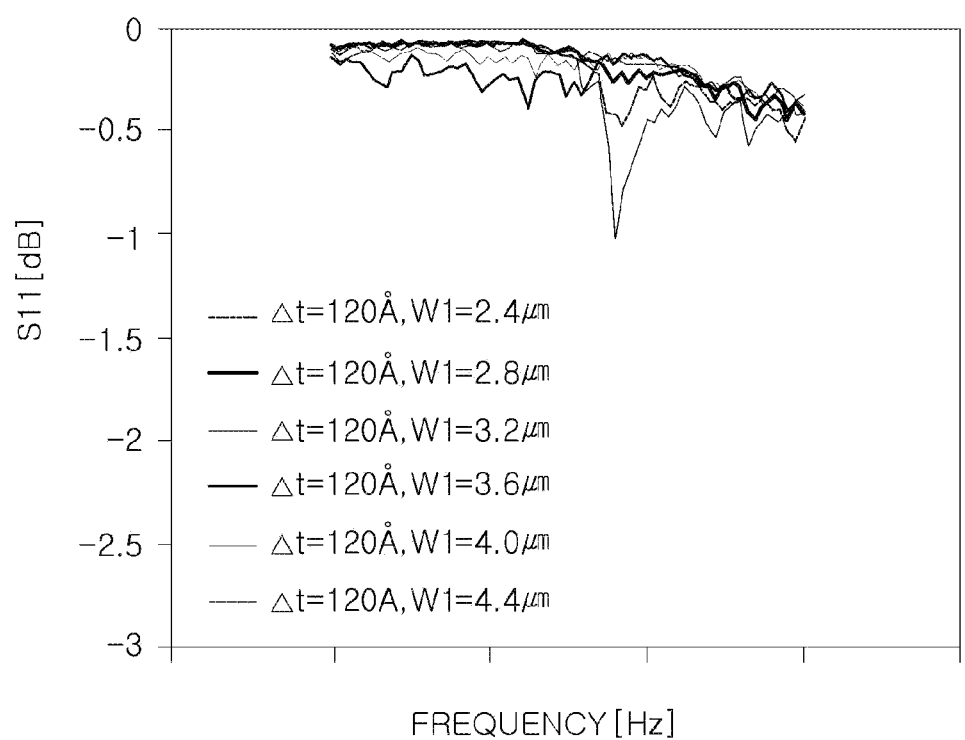
FIG. 10 is a graph illustrating a value of S11 according to the width of the first region R when the difference in thickness of the protruding portion and the extended portion of the passivation layer is 120 Å.
Figure 11:
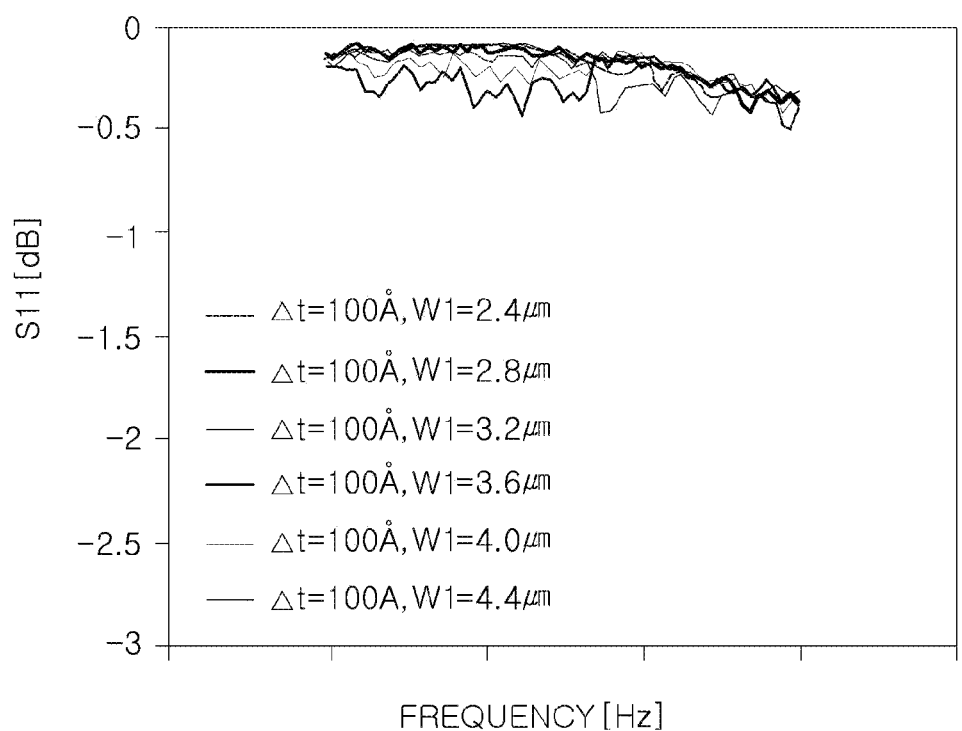
FIG. 11 is a graph illustrating a value of S11 according to the width of the first region R when the difference in thickness of the protruding portion and the extended portion of the passivation layer is 100 Å.
Figure 12:
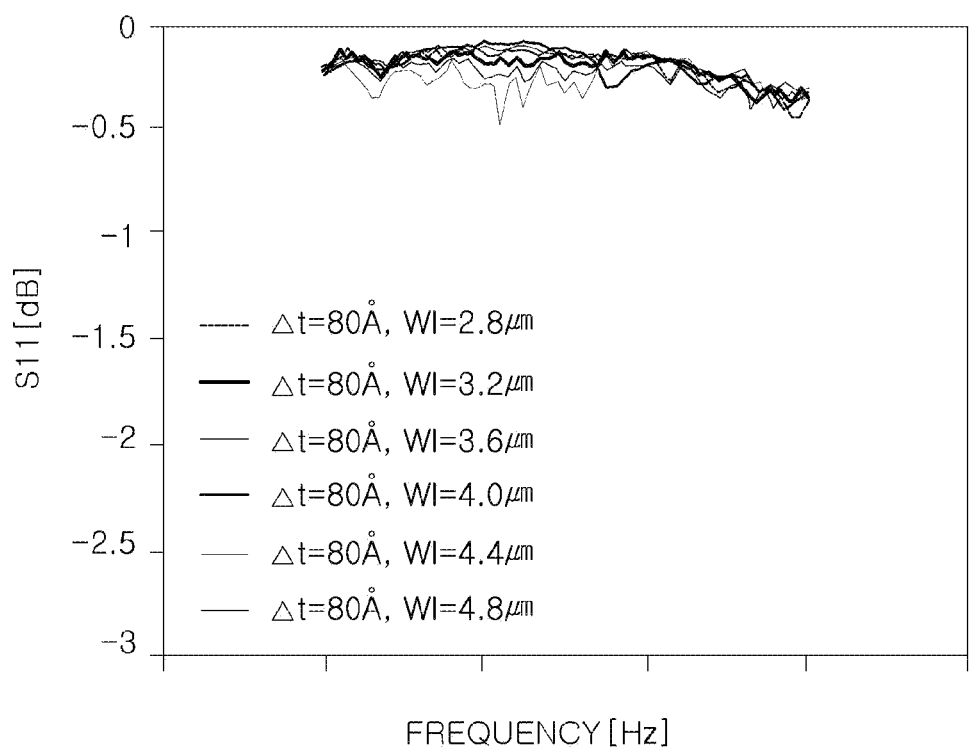
FIG. 12 is a graph illustrating a value of S11 according to the width of the first region when the difference in thickness of the protruding portion and the extended portion of the passivation layer is 80 Å.

FIG. 9 is a view illustrating a difference in thickness of a protruding portion and an extended portion of a passivation layer and a width of a first region, FIG. 10 is a graph illustrating a value of S11 according to the width of the first region R when the difference in thickness of the protruding portion and the extended portion of the passivation layer is 120 Å, FIG. 11 is a graph illustrating a value of S11 according to the width of the first region R when the difference in thickness of the protruding portion and the extended portion of the passivation layer is 100 Å, and FIG. 12 is a graph illustrating a value of S11 according to the width of the first region when the difference in thickness of the protruding portion and the extended portion of the passivation layer is 80 Å.

For the occurrence of minimum spurious noise when the difference in thickness ($\Delta t$) of the protruding portion 362 and the extended portion 364 of the passivation layer 360 is 120 Å, the width W1 of the first region R needs to be 2.8 μm or more. In addition, as illustrated in FIG. 10, it may be seen that a notch occurs when the width W1 of the first region R is 4.0 μm or more.

Meanwhile, for the occurrence of minimum spurious noise when the difference in thickness ($\Delta t$) of the protruding portion 362 and the extended portion 364 of the passivation layer 360 is 100 Å, the width W1 of the first region R needs to be 2.8 μm or more. In addition, as illustrated in FIG. 11, it may be seen that a notch occurs when the width W1 of the first region R is 4.4 μm or more.

In addition, for the occurrence of minimum spurious noise when the difference in thickness ($\Delta t$) of the protruding portion 362 and the extended portion 364 of the passivation layer 360 is 80 Å, the width W1 of the first region R needs to be 3.2 μm or more. In addition, as illustrated in FIG. 12, it may be seen that a notch occurs when the width W1 of the first region R is 4.8 μm or more.

As such, when the passivation layer 360 includes the protruding portion 362 and the extended portion 364, the difference value between the width W1 of the first region R for occurrence of the minimum spurious noise and the width W1 of the first region R in which the notch occurs may be relatively increased as compared to the case in which the first electrode 140 of the bulk acoustic wave resonator 100 described above includes the protruding portion 142 and the extended portion 144.

Figure 13:
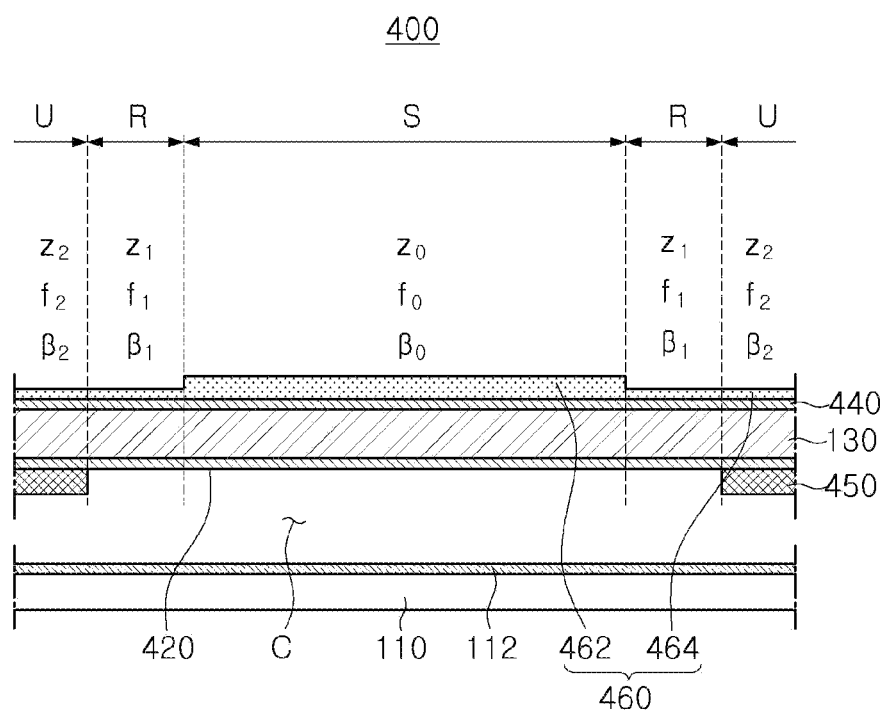
FIGS. 13 through 17 are schematic configuration views illustrating main configurations of bulk acoustic wave resonators according to example embodiments in the present disclosure.

FIG. 13 is a schematic configuration view illustrating a partial configuration of a bulk acoustic wave resonator according to an example embodiment in the present disclosure.

Referring to FIG. 13, a bulk acoustic wave resonator 400 may include the substrate 110, a first electrode 420, the piezoelectric layer 130, a second electrode 440, a lower frame 450, and a passivation layer 460.

Meanwhile, the substrate 110 and the piezoelectric layer 130 are the same components as those described above, and further detailed descriptions thereof will be omitted.

A cavity C may be disposed between the first electrode 420 and the substrate 110. As an example, the first electrode 420 may be used as any one of an input electrode and an output electrode that inputs and outputs an electrical signal such as a radio frequency (RF) signal.

Meanwhile, the first electrode 420 may be formed of, for example, a conductive material such as molybdenum (Mo) or an alloy thereof. However, the first electrode 420 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The second electrode 440 may overlap at least a portion of the piezoelectric layer 130. Meanwhile, the second electrode 440 may be used as any one of an input electrode and an output electrode that inputs and outputs an electrical signal such as a radio frequency (RF) signal. That is, in a case in which the first electrode 420 is used as the input electrode, the second electrode 440 may be used as the output electrode, and in a case in which the first electrode 420 is used as the output electrode, the second electrode 440 may be used as the input electrode.

The second electrode 440 may be formed of, for example, a conductive material such as molybdenum (Mo) or an alloy thereof. However, the second electrode 440 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The lower frame 450 may be disposed to be spaced apart from the substrate 110 and a portion of the cavity C may be disposed under the lower frame 450. In addition, the lower frame 450 may be formed on a bottom surface of the first electrode 420 and may have a ring shape. In addition, the lower frame 450 may be formed of an insulating material having a density lower than that of the first electrode 420. For example, the lower frame 450 may be formed of an insulating material such as silicon oxide ($SiO_2$), silicon nitride (SiN), and aluminum oxide ($Al_2O_3$). Meanwhile, an inner end of the lower frame 450 and an end of a protruding portion 462 to be described later may be disposed to be spaced apart in the horizontal direction.

The passivation layer 460 may overlap at least a portion of the second electrode 440. Meanwhile, the passivation layer 460 may serve to prevent damage to the first electrode 420 and the second electrode 440 during the process. As an example, the passivation layer 460 may be formed of an insulating material. In other words, the passivation layer 460 may be formed of an insulating material such as silicon oxide ($SiO_2$), silicon nitride (SiN), and aluminum oxide ($Al_2O_3$) having a density lower than that of the first electrode 420. In addition, the passivation layer 460 may include a protruding portion 462 having a first thickness t1 and an extended portion 464 having a thickness less than that of the protruding portion 462. The thickness of the extended portion 464 is defined as a second thickness t2.

Meanwhile, in the present example embodiment, the active region S, the first region R, and the second region U may also be continuously disposed.

As described above, the lower frame 450 may be formed of the insulating material having the density lower than that of the first electrode 420. Accordingly, an acoustic impedance value for a lateral wave generated at an anti-resonant frequency becomes very large, and a difference between $z_2$ and $z_0$ may be increased. Therefore, the bulk acoustic wave resonator 400 may obtain higher Q performance. In addition, when a value of $z_2$ in the second region U is increased compared to $z_0$ in the active region S, a $kt^2$ performance corresponding to an electromechanical coupling coefficient may also be increased.

Further, since the passivation layer 460 includes the protruding portion 462 and the extended portion 464, the value of the Lateral Wave Number $\beta_1$ in the first region R may be formed smaller as compared to the case in which the second electrode 140 of the bulk acoustic wave resonator 100 described above includes the protruding portion 142 and the extended portion 144. As a result, since the value of the width W1 of the first region R may be increased, the influence of the notch or the like that may occur due to the process error may be reduced.

Figure 14:
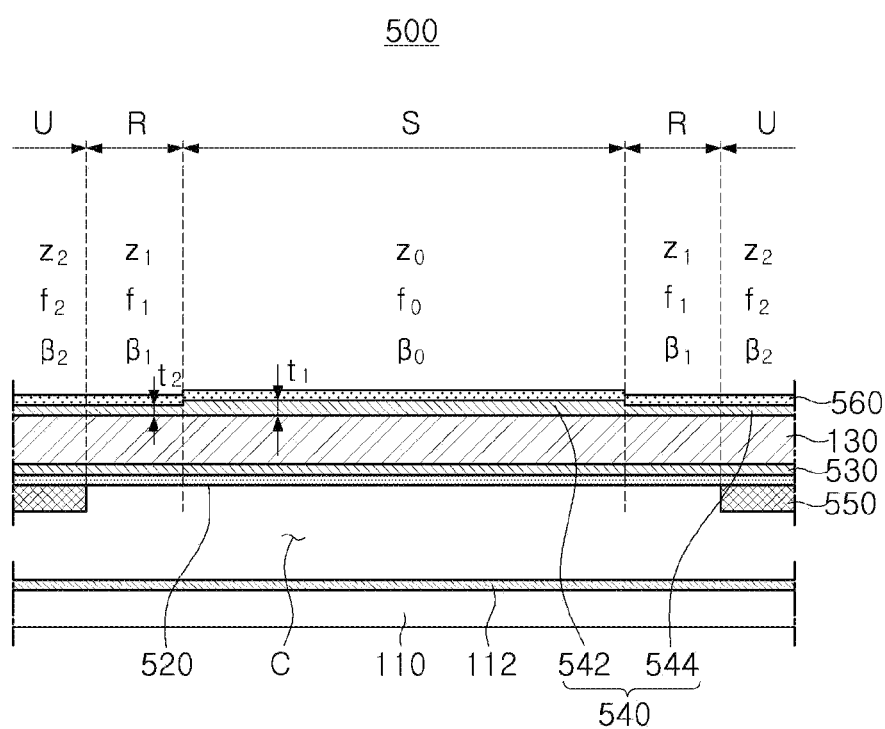

FIG. 14 is a schematic configuration view illustrating a partial configuration of a bulk acoustic wave resonator according to an example embodiment in the present disclosure.

Referring to FIG. 14, a bulk acoustic wave resonator 500 may include the substrate 110, an additional layer 520, a first electrode 530, the piezoelectric layer 130, a second electrode 540, a lower frame 550, and a passivation layer 560.

Meanwhile, since the substrate 110 and the piezoelectric layer 130 are the same as the components described in the bulk acoustic wave resonator 100 described above, further detailed descriptions thereof will be omitted.

The additional layer 520 may form the cavity C together with the substrate 110. Meanwhile, the additional layer 520 serves to improve crystallinity of the first electrode 530 and the piezoelectric layer 130. In addition, the additional layer 530 may serve as a mechanical support layer to relieve stress, and may serve to prevent damage to the first electrode 530 when a sacrificial layer (not illustrated) that is removed when the cavity C is formed in the manufacturing process is removed.

For example, the additional layer 520 may be formed of an insulating material, for example, aluminum nitride (AlN), silicon oxide ($SiO_2$), silicon nitride (SiN), and aluminum oxide ($Al_2O_3$).

The first electrode 530 may overlap at least a portion of the addition layer 520. The first electrode 530 may be used as any one of an input electrode and an output electrode that inputs and outputs an electrical signal such as a radio frequency (RF) signal.

Meanwhile, the first electrode 530 may be formed of, for example, a conductive material such as molybdenum (Mo) or an alloy thereof. However, the first electrode 530 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The second electrode 540 may overlap at least a portion of the piezoelectric layer 130. Meanwhile, the second electrode 540 may be used as any one of an input electrode and an output electrode that inputs and outputs an electrical signal such as a radio frequency (RF) signal. That is, in a case in which the first electrode 530 is used as the input electrode, the second electrode 540 may be used as the output electrode, and in a case in which the first electrode 530 is used as the output electrode, the second electrode 540 may be used as the input electrode.

The second electrode 540 may be formed of, for example, a conductive material such as molybdenum (Mo) or an alloy thereof. However, the second electrode 540 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

Meanwhile, the second electrode 540 may include a protruding portion 542 having a first thickness t1 and an extended portion 544 having a thickness less than that of the protruding portion 542. The thickness of the extended portion 544 is defined as a second thickness t2.

In addition, a region in which the protruding portion 542, the piezoelectric layer 130, and the first electrode 530 are disposed to all overlap is defined as an active region S, a region disposed between an end of the protruding portion 542 and an inner end of the lower frame 550 is defined as a first region R, and a region in which the extended portion 544 and the lower frame 550 are disposed to overlap is defined as a second region U.

Meanwhile, the first region R may be disposed outside of the active region S, and the second region U may be disposed outside of the first region R. In addition, the active region S, the first region R, and the second region U may be continuously disposed.

In addition, frequencies in the active region S, the first region R, and the second region U are referred to as $f_0$, $f_1$, and $f_2$, lateral wave numbers in the active region S, the first region R, and the second region U are referred to as $\beta_0$, $\beta_1$, and $\beta_2$, and acoustic impedances in the active region S, the first region R, and the second region U are referred to as $z_0$, $z_1$, and $z_2$, respectively.

In addition, the frequencies $f_0$, $f_1$, and $f_2$ in the active region S, the first region R, and the second region U may have a relationship of $f_2 < f_0 < f_1$.

In addition, in a resonance frequency, $\beta_0$ may be 0, $\beta_1$ may be a real number value, and $\beta_2$ may be an imaginary number value.

The lower frame 550 may be disposed to be spaced apart from the substrate 110 and a portion of the cavity C may be disposed under the lower frame 550. In addition, the lower frame 550 may be formed on a bottom surface of the additional layer 520 and may have a ring shape. In addition, the lower frame 550 may be formed of an insulating material having a density lower than that of the first electrode 530. For example, the lower frame 550 may be formed of an insulating material such as silicon oxide ($SiO_2$), silicon nitride (SiN), and aluminum oxide ($Al_2O_3$). Meanwhile, an inner end of the lower frame 550 and an end of a protruding portion 542 may be disposed to be spaced apart in the horizontal direction.

The passivation layer 560 may overlap at least a portion of the second electrode 540. Meanwhile, the passivation layer 560 may serve to prevent damage to the first electrode 530 and the second electrode 540 during the process. As an example, the passivation layer 560 may be formed of an insulating material. In other words, the passivation layer 560 may be formed of an insulating material such as silicon oxide ($SiO_2$), silicon nitride (SiN), and aluminum oxide ($Al_2O_3$).

Figure 15:
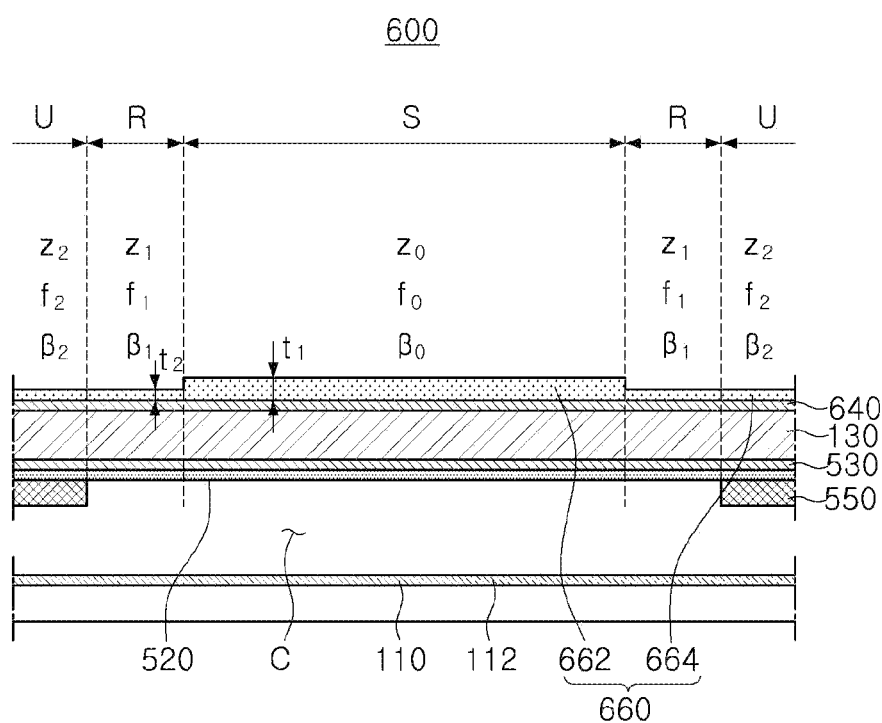

FIG. 15 is a schematic configuration view illustrating a partial configuration of a bulk acoustic wave resonator according to an example embodiment in the present disclosure.

Referring to FIG. 15, a bulk acoustic wave resonator 600 may include the substrate 110, the additional layer 520, the first electrode 530, the piezoelectric layer 130, a second electrode 640, the lower frame 550, and a passivation layer 660.

Meanwhile, since the substrate 110 and the piezoelectric layer 130 are the same as the components described in the bulk acoustic wave resonator 100, and the additional layer 520, the first electrode 530, and the lower frame 550 are the same as the component described in the bulk acoustic wave resonator 500 described above, further detailed descriptions thereof will be omitted herein.

The second electrode 640 may overlap at least a portion of the piezoelectric layer 130. Meanwhile, the second electrode 640 may be used as any one of an input electrode and an output electrode that inputs and outputs an electrical signal such as a radio frequency (RF) signal. That is, in a case in which the first electrode 530 is used as the input electrode, the second electrode 640 may be used as the output electrode, and in a case in which the first electrode 530 is used as the output electrode, the second electrode 640 may be used as the input electrode.

The second electrode 640 may be formed of, for example, a conductive material such as molybdenum (Mo) or an alloy thereof. However, the second electrode 640 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The passivation layer 660 may overlap at least a portion of the second electrode 640. Meanwhile, the passivation layer 660 may serve to prevent damage to the first electrode 530 and the second electrode 640 during the process. As an example, the passivation layer 660 may be formed of an insulating material. In other words, the passivation layer 660 may be formed of an insulating material such as silicon oxide ($SiO_2$), silicon nitride (SiN), and aluminum oxide ($Al_2O_3$) having a density lower than that of the first electrode 530. In addition, the passivation layer 660 may include a protruding portion 662 having a first thickness t1 and an extended portion 664 having a thickness less than that of the protruding portion 662. The thickness of the extended portion 664 is defined as a second thickness t2.

Meanwhile, in the present example embodiment, the active region S, the first region R, and the second region U may also be continuously disposed.

Figure 16:
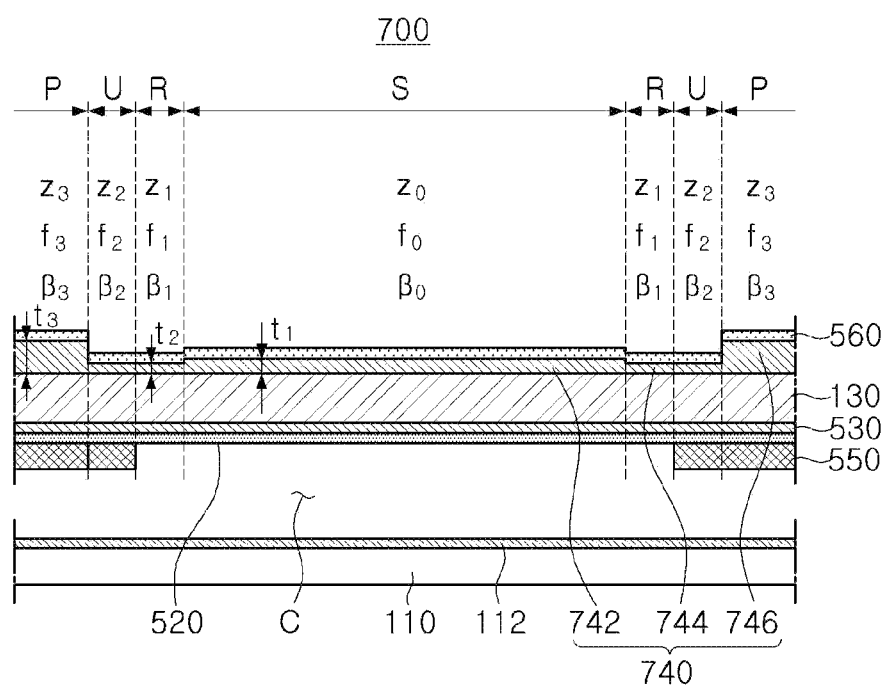

FIG. 16 is a schematic configuration view illustrating a partial configuration of a bulk acoustic wave resonator according to an example embodiment in the present disclosure.

Referring to FIG. 16, a bulk acoustic wave resonator 700 may include the substrate 110, the additional layer 520, the first electrode 530, the piezoelectric layer 130, a second electrode 740, the lower frame 550, and the passivation layer 560.

Meanwhile, since the substrate 110 and the piezoelectric layer 130 are the same as the components described in the bulk acoustic wave resonator 100, and the additional layer 520, the first electrode 530, the lower frame 550, and the passivation layer 560 are the same as the component described in the bulk acoustic wave resonator 500 described above, further detailed descriptions thereof will be omitted herein.

The second electrode 740 may overlap at least a portion of the piezoelectric layer 130. Meanwhile, the second electrode 740 may be used as any one of an input electrode and an output electrode that inputs and outputs an electrical signal such as a radio frequency (RF) signal. That is, in a case in which the first electrode 530 is used as the input electrode, the second electrode 740 may be used as the output electrode, and in a case in which the first electrode 530 is used as the output electrode, the second electrode 740 may be used as the input electrode.

The second electrode 740 may be formed of, for example, a conductive material such as molybdenum (Mo) or an alloy thereof. However, the second electrode 740 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

Meanwhile, the second electrode 740 may include a protruding portion 742 having a first thickness t1, an extended portion 744 having a thickness less than that of the protruding portion 742, and a frame portion 746 disposed outside of the extended portion 744. The thickness of the extended portion 744 is defined as a second thickness t2, and the thickness of the frame portion 746 is defined as a third thickness t3. Meanwhile, the first, second, and third thicknesses t1, t2, and t3 may have a relationship of t3>t1>t2.

In addition, a region in which the protruding portion 742, the piezoelectric layer 130, and the first electrode 530 are disposed to all overlap is defined as an active region S, a region disposed between an end of the protruding portion 742 and an inner end of the lower frame 550 is defined as a first region R, a region disposed between the inner end of the lower frame 550 and an inner end of the frame portion 746 is defined as a second region U, and a region in which the lower frame 550 and the frame portion 746 are disposed to overlap is defined as a third region P.

Meanwhile, the first region R may be disposed outside of the active region S, the second region U may be disposed outside of the first region R, and the third region P may be disposed outside of the second region U. In addition, the active region S, the first region R, the second region U, and the third region P may be continuously disposed.

In addition, frequencies in the active region S, the first region R, the second region U, and the third region P are referred to as $f_0$, $f_1$, $f_2$, and $f_3$, lateral wave numbers in the active region S, the first region R, the second region U, and the third region P are referred to as $\beta_0$, $\beta_1$, $\beta_2$, and $\beta_3$, and acoustic impedances in the active region S, the first region R, the second region U, and third region P are referred to as $z_0$, $z_1$, $z_2$, and $z_3$, respectively.

As described above, since the second electrode 740 includes the frame portion 746, the lower frame 550 and the frame portion 746 may function as a double reflective boundary structure. Accordingly, reflection efficiency for a plurality of lateral waves existing near the anti-resonant frequency may be increased. As a result, a Q performance of the bulk acoustic wave resonator 700 may be improved.

Meanwhile, in the present example embodiment, the acoustic impedance values $z_2$ and $z_3$ may have a larger value compared to $z_0$. Accordingly, the Q performance of the bulk acoustic wave resonator 700 may be further improved.

Figure 17:
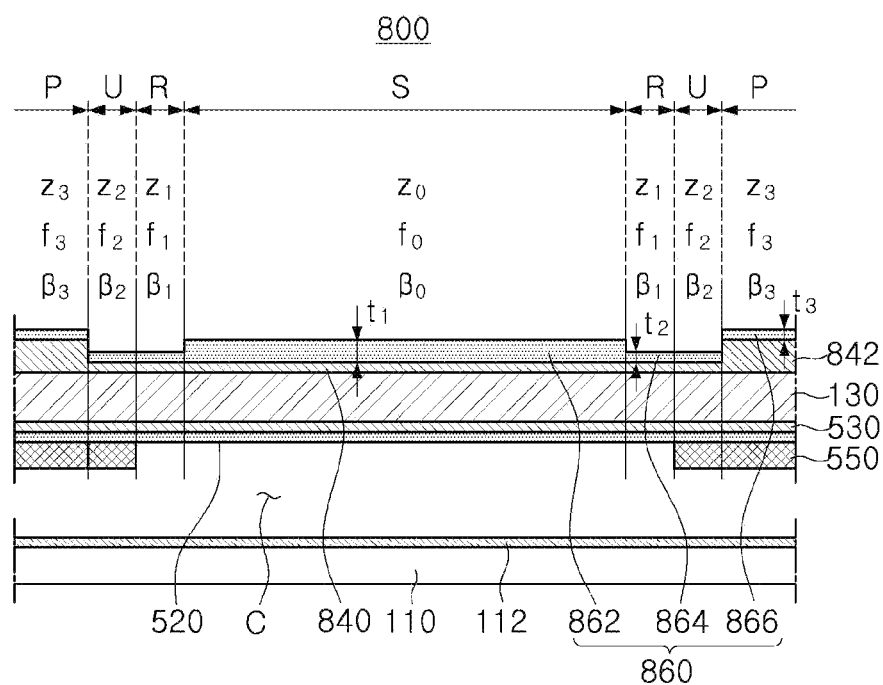

FIG. 17 is a schematic configuration view illustrating a partial configuration of a bulk acoustic wave resonator according to an example embodiment in the present disclosure.

Referring to FIG. 17, a bulk acoustic wave resonator 800 may include the substrate 110, the additional layer 520, the first electrode 530, the piezoelectric layer 130, a second electrode 840, the lower frame 550, and a passivation layer 860.

Meanwhile, since the substrate 110 and the piezoelectric layer 130 are the same as the components described in the bulk acoustic wave resonator 100, and the additional layer 520, the first electrode 530, and the lower frame 550 are the same as the component described in the bulk acoustic wave resonator 500 described above, further detailed descriptions thereof will be omitted herein.

The second electrode 840 may overlap at least a portion of the piezoelectric layer 130. Meanwhile, the second electrode 840 may be used as any one of an input electrode and an output electrode that inputs and outputs an electrical signal such as a radio frequency (RF) signal. That is, in a case in which the first electrode 530 is used as the input electrode, the second electrode 840 may be used as the output electrode, and in a case in which the first electrode 530 is used as the output electrode, the second electrode 840 may be used as the input electrode.

The second electrode 840 may be formed of, for example, a conductive material such as molybdenum (Mo) or an alloy thereof. However, the second electrode 840 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The second electrode 840 may include a frame portion 842 having a thickness thicker than that of other portions.

The passivation layer 860 may overlap at least a portion of the second electrode 840. Meanwhile, the passivation layer 860 may serve to prevent damage to the first electrode 530 and the second electrode 840 during the process. As an example, the passivation layer 860 may be formed of an insulating material. In other words, the passivation layer 860 may be formed of an insulating material such as silicon oxide ($SiO_2$), silicon nitride (SiN), and aluminum oxide ($Al_2O_3$) having a density lower than that of the first electrode 530. In addition, the passivation layer 860 may include a protruding portion 862 having a first thickness t1, an extended portion 864 having a thickness less than that of the protruding portion 862, and an edge portion 866 disposed to cover a frame portion 842 of the second electrode 840. The thickness of the extended portion 864 is defined as a second thickness t2, and the thickness of the edge portion 866 is defined as a third thickness t3. Meanwhile, the first thickness t1 may have a value greater than the second thickness t2.

In addition, a region in which the protruding portion 862, the piezoelectric layer 130, and the first electrode 530 are disposed to all overlap is defined as an active region S, a region disposed between an end of the protruding portion 862 and an inner end of the lower frame 550 is defined as a first region R, a region disposed between the inner end of the lower frame 550 and an inner end of the frame portion 842 is defined as a second region U, and a region in which the lower frame 550 and the frame portion 842 are disposed to overlap is defined as a third region P.

Meanwhile, the first region R may be disposed outside of the active region S, the second region U may be disposed outside of the first region R, and the third region P may be disposed outside of the second region U. In addition, the active region S, the first region R, the second region U, and the third region P may be continuously disposed.

In addition, frequencies in the active region S, the first region R, the second region U, and the third region P are referred to as $f_0$, $f_1$, $f_2$, and $f_3$, lateral wave numbers in the active region S, the first region R, the second region U, and the third region P are referred to as $\beta_0$, $\beta_1$, $\beta_2$, and $\beta_3$, and acoustic impedances in the active region S, the first region R, the second region U, and third region P are referred to as $z_0$, $z_1$, $z_2$, and $z_3$, respectively.

As described above, since the second electrode 840 includes the frame portion 842, the lower frame 550 and the frame portion 842 may function as a double reflective boundary structure. Accordingly, reflection efficiency for a plurality of lateral waves existing near the anti-resonant frequency may be increased. As a result, a Q performance of the bulk acoustic wave resonator 800 may be improved.

Meanwhile, in the present example embodiment, the acoustic impedance values $z_2$ and $z_3$ may have a larger value compared to $z_0$. Accordingly, the Q performance of the bulk acoustic wave resonator 800 may be further improved.

Figure 18:
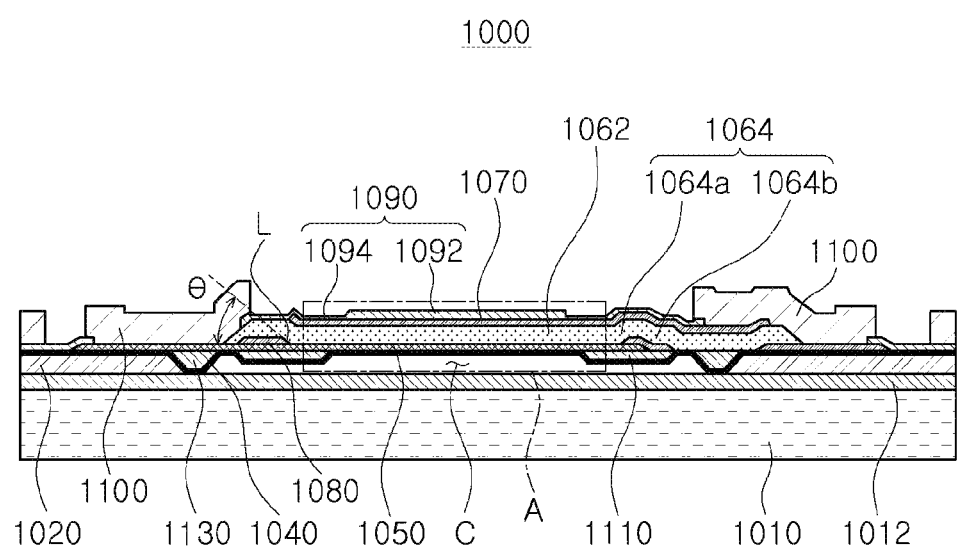
FIG. 18 is a schematic cross-sectional view illustrating a bulk acoustic wave resonator according to an example embodiment in the present disclosure.
Figure 19:
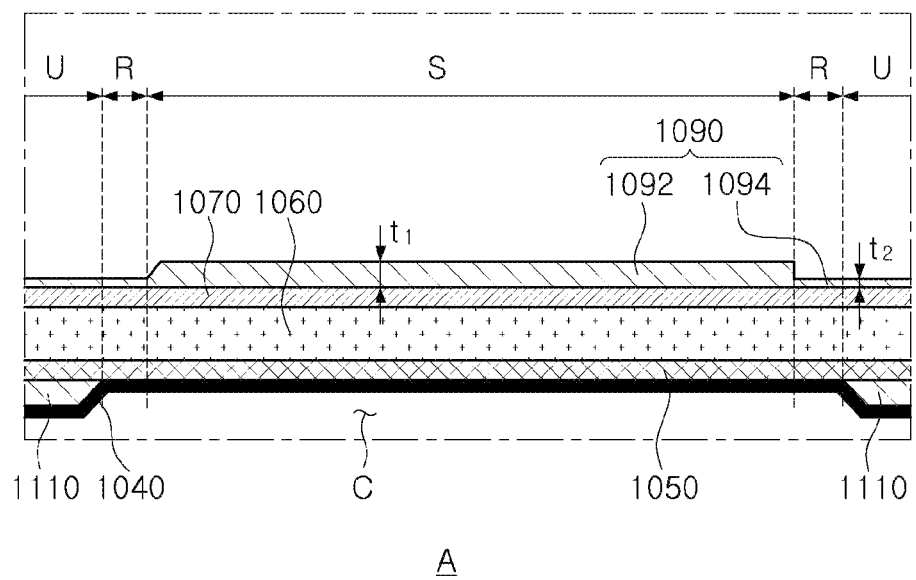
FIG. 19 is an enlarged view illustrating part A of FIG. 18.

FIG. 18 is a schematic cross-sectional view illustrating a bulk acoustic wave resonator according to an example embodiment in the present disclosure, and FIG. 19 is an enlarged view illustrating part A of FIG. 18.

Referring to FIGS. 18 and 19, a bulk acoustic wave resonator 1000 according to an example embodiment in the present disclosure may include a substrate 1010, a sacrificial layer 1020, an etching preventing portion 1030, a membrane layer 1040, a first electrode 1050, a piezoelectric layer 1060, a second electrode 1070, an insertion layer 1080, a passivation layer 1090, a metal pad 1100, and a lower frame 1110.

The substrate 1010 may be a silicon substrate. For example, a silicon wafer or a silicon on insulator (SOI) type substrate may be used as the substrate 1010.

An insulating layer 1012 may be formed on an upper surface of the substrate 1010 and may electrically isolate components disposed on the substrate 1010 from the substrate 1010. In addition, the insulating layer 1012 may prevent the substrate 1010 from being etched by an etching gas at the time of forming a cavity C in a process of manufacturing the bulk acoustic wave resonator.

In this case, the insulating layer 1012 may be formed of at least one of silicon dioxide ($SiO_2$), silicon nitride ($Si_3N_4$), aluminum oxide ($Al_2O_3$), and aluminum nitride (AlN), and may be formed by any one of a chemical vapor deposition process, a radio frequency (RF) magnetron sputtering process, and an evaporation process.

The sacrificial layer 1020 may be formed on the insulating layer 1012, and the cavity C and the etching preventing portion 1030 may be disposed in the sacrificial layer 1020. The cavity C may be formed by removing a portion of the sacrificial layer 1020 at the time of manufacturing the bulk acoustic wave resonator. As described above, as the cavity C is formed in the sacrificial layer 1020, the first electrode 1050 and the like formed on the sacrificial layer 1020 may be flat.

The etching preventing portion 1030 may be disposed along a boundary of the cavity C. The etching preventing portion 1030 may serve to prevent etching from being performed beyond a cavity region in a process of forming the cavity C.

The membrane layer 1040 may form the cavity C together with the substrate 1010. In addition, the membrane layer 1040 may be formed of a material having low reactivity with the etching gas at the time of removing the sacrificial layer 1020. Meanwhile, as the membrane layer 1040, a dielectric layer containing a material selected from the group consisting of, for example, silicon nitride ($Si_3N_4$), silicon dioxide ($SiO_2$), manganese oxide (MnO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and a zinc oxide (ZnO) may be used.

Meanwhile, a seed layer (not illustrated) formed of aluminum nitride (AlN) may be formed on the membrane layer 1040. That is, the seed layer may be disposed between the membrane layer 1040 and the first electrode 1050. The seed layer may be formed using a dielectric substance or a metal having a hexagonal close packed (HCP) structure, in addition to AlN. As an example, when the seed layer is formed of the metal, the seed layer may be formed of titanium (Ti). However, the seed layer is not limited thereto, and may also be formed instead of the membrane layer 1040.

The first electrode 1050 may be formed on the membrane layer 1040, and a portion thereof may be disposed above the cavity C. In addition, the first electrode 1050 may be used as any one of an input electrode and an output electrode that inputs and outputs an electrical signal such as a radio frequency (RF) signal.

The first electrode 1050 may be formed of, for example, a conductive material such as molybdenum (Mo) or an alloy thereof. However, the first electrode 1050 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The piezoelectric layer 1060 may be disposed to at least cover the first electrode 1050 disposed above the cavity C. Meanwhile, the piezoelectric layer 1060 may be a portion that causes a piezoelectric effect converting electrical energy into mechanical energy in the form of an elastic wave, and may be formed of one of an aluminum nitride (AlN), a zinc oxide (ZnO), and a lead zirconium titanium oxide (PZT; PbZrTiO). In particular, in the case in which the piezoelectric layer 1060 is formed of the aluminum nitride (AlN), the piezoelectric layer 1060 may further include a rare earth metal. As an example, the rare earth metal may include at least one of scandium (Sc), erbium (Er), yttrium (Y), and lanthanum (La). In addition, as an example, a transition metal may include at least one of titanium (Ti), zirconium (Zr), hafnium (Hf), tantalum (Ta), and niobium (Nb). In addition, the transition metal may also include magnesium (Mg), a divalent metal.

Meanwhile, the piezoelectric layer 1060 may include a piezoelectric portion 1062 formed to be flat, and a bent portion 1064 extending from the piezoelectric portion 1062.

The piezoelectric portion 1062 may be a portion directly stacked on an upper surface of the first electrode 1050. Therefore, the piezoelectric portion 1062 may be interposed between the first electrode 1050 and the second electrode 1070 and may be formed in a flat shape together with the first electrode 1050 and the second electrode 1070.

The bent portion 1064 may be disposed on an insertion layer 1080 to be described below, and may protrude along a shape of the insertion layer 1080. Therefore, the piezoelectric layer 1060 may be bent at a boundary between the piezoelectric portion 1062 and the bent portion 1064, and the bent portion 1064 may protrude depending on a thickness and a shape of the insertion layer 1080.

The bent portion 1064 may be divided into an inclined portion 1064a and an edge portion 1064b.

The inclined portion 1064a may refer to a portion inclined along an inclined surface L of an insertion layer 1080 to be described below. In addition, the edge portion 1064b may refer to a portion extending outwardly from the inclined portion 1064a.

The inclined portion 1064a may be formed in parallel with the inclined surface L of the insertion layer 1080, and an inclined angle of the inclined portion 1064a may be the same as an inclined angle θ of the inclined surface L of the insertion layer 1080.

The second electrode 1070 may be disposed to at least cover the piezoelectric layer 1060 disposed on the cavity C. The second electrode 1070 may be used as any one of an input electrode and an output electrode that inputs and outputs an electrical signal such as a radio frequency (RF) signal. That is, in a case in which the first electrode 1050 is used as the input electrode, the second electrode 1070 may be used as the output electrode, and in a case in which the first electrode 1050 is used as the output electrode, the second electrode 1070 may be used as the input electrode.

The second electrode 1070 may be formed of, for example, a conductive material such as molybdenum (Mo) or an alloy thereof. However, the second electrode 1070 is not limited thereto and may be formed of a conductive material such as ruthenium (Ru), tungsten (W), iridium (Ir), platinum (Pt), copper (Cu), titanium (Ti), tantalum (Ta), nickel (Ni), or chromium (Cr), or an alloy thereof.

The insertion layer 1080 may be disposed between the first electrode 1050 and the piezoelectric layer 1060. The insertion layer 1080 may be formed of a dielectric material such as a silicon dioxide ($SiO_2$), an aluminum nitride (AlN), an aluminum oxide ($Al_2O_3$), a silicon nitride ($Si_3N_4$), a manganese oxide (MnO), a zirconium oxide ($ZrO_2$), a lead zirconate titanate (PZT), a gallium arsenide (GaAs), a hafnium oxide ($HfO_2$), a titanium oxide ($TiO_2$), a zinc oxide (ZnO), or the like, but may be formed of a material different from that of the piezoelectric layer 1060.

In addition, at least a portion of the insertion layer 1080 may be disposed between the piezoelectric layer 1060 and the first electrode 1050. As an example, the insertion layer 1080 may have a ring shape.

The passivation layer 1090 may be formed on a region except for portions of the first electrode 1050 and the second electrode 1070. Meanwhile, the passivation layer 1090 may serve to prevent damage to the second electrode 1070 and the first electrode 1050 during the process.

Meanwhile, as the passivation layer 1090, a dielectric layer containing a material selected from the group consisting of, for example, silicon nitride ($Si_3N_4$), silicon dioxide ($SiO_2$), manganese oxide (MnO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and a zinc oxide (ZnO) may be used.

Meanwhile, as illustrated in more detail in FIG. 19, the passivation layer 1090 may include a protruding portion 1092 having a first thickness t1 and an extended portion 1094 having a thickness less than that of the protruding portion 1092. The thickness of the extended portion 1094 is defined as a second thickness t2.

In addition, a region in which the protruding portion 1092, the piezoelectric layer 1060, and the first electrode 1050 are disposed to all overlap is defined as an active region S, a region disposed between an end of the protruding portion 1092 and an inner end of the lower frame 1110 is defined as a first region R, and a region in which the extended portion 1094 and the lower frame 1110 are disposed to overlap is defined as a second region U.

Meanwhile, the first region R may be disposed outside of the active region S, and the second region U may be disposed outside of the first region R. In addition, the active region S, the first region R, and the second region U may be continuously disposed.

The metal pads 1100 may be formed on portions of the first electrode 1050 and the second electrode 1070 on which the passivation layer 1090 is not formed. As an example, the metal pads 1100 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

The lower frame 1110 may be disposed to be spaced apart from the substrate 1010 and a portion of the cavity C may be disposed under the lower frame 1110. As an example, the lower frame 1110 may be formed to have a ring shape on a bottom surface of the first electrode 1050. In addition, an inner end of the lower frame 1110 and an end of a protruding portion 1092 may be disposed to be spaced apart in the horizontal direction, and at least a portion of the lower frame 1110 may overlap the extended portion 1094 of the passivation layer 1090. Meanwhile, the lower frame 1110 may be formed of an insulating material having a density lower than that of the first electrode 1050. As an example, the lower frame 1110 may be formed of an insulating material such as silicon oxide ($SiO_2$), silicon nitride (SiN), and aluminum oxide ($Al_2O_3$).

As described above, since the passivation layer 1090 includes the protruding portion 1092 and the extended portion 1094 and the lower frame 1110 disposed in the cavity C is provided, an occurrence of spurious noise and notch may be reduced.

Accordingly, the performance of the bulk acoustic wave resonator 1000 may be improved.

As set forth above, according to the example embodiments in the present disclosure, the occurrence of spurious noise and notch may be reduced.

While specific example embodiments have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
   a substrate;
   a first electrode, wherein a cavity is formed between the substrate and the first electrode;
   a piezoelectric layer disposed on the first electrode and overlapping at least a portion of the first electrode;
   a second electrode disposed on the piezoelectric layer and overlapping at least a portion of the piezoelectric layer;
   a passivation layer having at least a portion disposed on the second electrode and overlapping at least a portion of the second electrode; and
   a lower frame spaced apart from the substrate and having a portion of the cavity disposed therebetween,
   wherein any one of the second electrode and the passivation layer includes a protruding portion having a first thickness and an extended portion having a second thickness less than the first thickness, and
   wherein an inner end of the lower frame and an end of the protruding portion are spaced apart in a horizontal direction.

2. The bulk acoustic wave resonator of claim 1, wherein at least a portion of the extended portion overlaps the lower frame.

3. The bulk acoustic wave resonator of claim 1, wherein the lower frame is formed of the same material as the first electrode.

4. The bulk acoustic wave resonator of claim 1, wherein the lower frame is disposed under the first electrode and formed of a different material from the first electrode.

5. The bulk acoustic wave resonator of claim 4, wherein the lower frame is formed of an insulating material having a density lower than that of the first electrode.

6. The bulk acoustic wave resonator of claim 1, wherein the passivation layer includes the protruding portion and the extended portion, and the passivation layer is formed of an insulating material having a density lower than that of the first electrode.

7. The bulk acoustic wave resonator of claim 1, further comprising an additional layer disposed between the lower frame and the first electrode.

8. The bulk acoustic wave resonator of claim 1, wherein the second electrode includes a frame portion having at least a portion overlapping the lower frame and having a thickness greater than the first thickness.

9. The bulk acoustic wave resonator of claim 8, wherein an inner end of the frame portion and the inner end of the lower frame are spaced apart in the horizontal direction.

10. The bulk acoustic wave resonator of claim 9, further comprising an additional layer disposed between the lower frame and the first electrode.

11. The bulk acoustic wave resonator of claim 9, wherein the lower frame is disposed under the first electrode and formed of a different material from the first electrode.

12. The bulk acoustic wave resonator of claim 11, wherein the lower frame is formed of an insulating material having a density lower than that of the first electrode.

13. The bulk acoustic wave resonator of claim 9, wherein the passivation layer includes the protruding portion and the extended portion, and the passivation layer is formed of an insulating material having a density lower than that of the first electrode.

14. The bulk acoustic wave resonator of claim 1, further comprising an etching preventing layer disposed to surround the cavity.

15. The bulk acoustic wave resonator of claim 14, further comprising a sacrificial layer disposed outside of the etching preventing layer.

16. The bulk acoustic wave resonator of claim 14, further comprising an insertion layer disposed between the first electrode and the piezoelectric layer.

17. A bulk acoustic wave resonator comprising:
   a substrate;
   a first electrode, wherein a cavity is disposed between the substrate and the first electrode;
   a piezoelectric layer disposed on the first electrode and overlapping at least a portion of the first electrode;
   a second electrode disposed on the piezoelectric layer and overlapping at least a portion of the piezoelectric layer;
   a passivation layer having at least a portion disposed on the second electrode and overlapping at least a portion of the second electrode; and
   a lower frame spaced apart from the substrate and having a portion of the cavity disposed therebetween,
   wherein any one of the second electrode and the passivation layer includes a protruding portion having a first thickness and an extended portion having a second thickness less than the first thickness, and
   wherein an active region in which the protruding portion, the piezoelectric layer, and the first electrode all overlap, a first region disposed between an end of the active region and an inner end of the lower frame, and a second region disposed outside of the first region and in which the extended portion and the lower frame overlap, are continuously disposed.

18. The bulk acoustic wave resonator of claim 17, wherein frequencies f0, f1, and f2 in the active region, the first region, and the second region have a relationship of $f2<f0<f1$.

19. The bulk acoustic wave resonator of claim 18, wherein when lateral wave numbers in the active region, the first region, and the second region are $\beta0$, $\beta1$, and $\beta2$, $\beta0$ has 0, $\beta1$ has a real number value, and $\beta2$ has an imaginary number value in a resonance frequency.

20. The bulk acoustic wave resonator of claim 18, wherein when acoustic impedances in the active region, the first region, and the second region are z0, z1, and z2, a value of z2 is greater than a value of z0.

21. A bulk acoustic wave resonator comprising:
a substrate;
a first electrode disposed on and spaced apart from the substrate by a cavity;
a piezoelectric layer disposed on the first electrode;
a second electrode disposed on the piezoelectric layer;
an upper layer of the bulk acoustic wave resonator disposed on the second electrode; and
a lower frame spaced apart from the substrate and having a portion of the cavity disposed therebetween,
wherein the upper layer includes a protruding portion having a first thickness and an extended portion having a second thickness less than the first thickness, and
wherein an inner end of the lower frame and an end of the protruding portion are spaced apart in a horizontal direction.

22. The bulk acoustic wave resonator of claim 21, wherein the upper layer comprises an upper portion of the second electrode or a passivation layer disposed on the second electrode.

* * * * *